United States Patent
Zhou et al.

(10) Patent No.: US 7,966,142 B2
(45) Date of Patent: Jun. 21, 2011

(54) MULTI-VARIABLE REGRESSION FOR METROLOGY

(75) Inventors: Wen Zhan Zhou, Singapore (SG); Zheng Zou, Singapore (SG); Jasper Goh, Singapore (SG); Mei Sheng Zhou, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 274 days.

(21) Appl. No.: 12/103,690

(22) Filed: Apr. 15, 2008

(65) Prior Publication Data

US 2009/0258445 A1     Oct. 15, 2009

(51) Int. Cl.
*G01D 21/00* (2006.01)
*G06F 19/00* (2011.01)

(52) U.S. Cl. ........................................ 702/85
(58) Field of Classification Search ............ 702/85
See application file for complete search history.

(56) References Cited

U.S. PATENT DOCUMENTS

| | | | |
|---|---|---|---|
| 6,746,882 B1 | 6/2004 | Stirton et al. | |
| 7,221,989 B2 | 5/2007 | Prager et al. | |
| 7,588,949 B2 * | 9/2009 | Vuong et al. | 438/16 |
| 2005/0197772 A1 * | 9/2005 | Archie et al. | 702/1 |
| 2007/0192049 A1 * | 8/2007 | Archie et al. | 702/85 |
| 2007/0239383 A1 * | 10/2007 | Funk et al. | 702/107 |
| 2008/0151268 A1 * | 6/2008 | Archie et al. | 356/625 |
| 2009/0031261 A1 * | 1/2009 | Smith et al. | 716/2 |
| 2009/0157343 A1 * | 6/2009 | Kaushal et al. | 702/97 |

* cited by examiner

*Primary Examiner* — Cindy Hien-Dieu Khuu
(74) *Attorney, Agent, or Firm* — Horizon IP Pte. Ltd.

(57) ABSTRACT

A method for assessing metrology tool accuracy is described. Multi-variable regression is used to define the accuracy of a metrology tool such that the interaction between different measurement parameters is taken into account. A metrology tool under test (MTUT) and a reference metrology tool (RMT) are used to measure a set of test profiles. The MTUT measures the test profiles to generate a MTUT data set for a first measurement parameter. The RMT measures the test profiles to generate RMT data sets for the first measurement parameter, and at least a second measurement parameter. Multi-variable regression is then performed to generate a best-fit plane for the data sets. The coefficient of determination ($R^2$ value) represents the accuracy index of the MTUT.

23 Claims, 6 Drawing Sheets

MULTI-VARIABLE REGRESSION FOR METROLOGY

FIELD OF THE INVENTION

The present invention relates generally to metrology tools, and more particularly to an improved method for assessing metrology tools.

BACKGROUND OF THE INVENTION

As semiconductor process technology moves to the 65 nm node and beyond, metrology requirements have become more stringent. Typical performance indicators of a metrology tool include its repeatability and reproducibility (R&R), and/or long-term reproducibility (or precision). Additionally, accuracy must also be considered.

One technique for accessing metrology tool accuracy is by comparing measurement data from a metrology tool under test (MTUT) with those from a reference metrology tool (RMT). For example, FIG. 1 shows a plot of critical dimension (CD) measurements from a MTUT, in this case a scanning electron microscope (SEM), with CD measurements from an atomic force microscope (AFM), RMT. Linear regression can be used to establish a relationship between the MTUT and the RMT. When performing regression, both the MTUT and the RMT are assumed to behave linearly. For example, the linear regression produces a best-fit straight line 110 represented by the equation $y = a \cdot x + b$, where:

y is the MTUT data set,
x is the RMT data set, and
a and b are the linear regression slope and offset respectively.

As shown in FIG. 1, the slope of the best-fit line is 1.2185, while its offset is 7.2768. This produces a regression residue ($R^2$) of 0.9494, which is used as an accuracy index of the MTUT. Alternatively, the total measurement uncertainty (TMU) approach described in, for example, U.S. Pat. No. 7,221,989 may be used to compare the measurements. In such case, the TMU value is used as the accuracy index of the MTUT.

It is desirable to provide an improved method for assessing the accuracy of metrology tools.

SUMMARY OF THE INVENTION

The present invention relates to an improved method for assessing metrology tools. In accordance with the invention, the method includes performing multi-variable regression to define the accuracy of a metrology tool. In such case, interaction between different measurement parameters can be taken into account.

In one embodiment, the method comprises measuring a target parameter of a plurality of test structures using a metrology tool under test (MTUT) to generate a test data set. A plurality of reference parameters from a plurality of test structures are measured using a reference metrology tool (RMT) to generate a plurality of reference data sets. The data sets are then analyzed using multi-variable regression.

In another embodiment, the invention relates to a method of fabricating integrated circuits. The method comprises assessing a MTUT by measuring a target parameter of a plurality of test structures using the MTUT to generate a test data set. A plurality of reference parameters of the plurality of test structures are measured using a RMT to generate a plurality of reference data sets. A multi-variable regression analysis is performed on the data sets. Using the assessed MTUT, a feature during processing is characterized. The information from the characterized feature is used to determine processing parameters for a processing tool which is used to process wafers to form ICs.

In yet another embodiment of the invention, a method for increasing accuracy of assessing a metrology tool under test (MTUT) is provided. The method includes measuring a target parameter of a plurality of test structures using the MTUT to generate a test data set. A plurality of reference parameters of the plurality of test structures are measured using a reference metrology tool (RMT) to generate a plurality of reference data sets. The method further includes performing a multi-variable regression analysis of the test and reference data sets to determine a coefficient of determination, wherein the coefficient of determination represents the accuracy index of the MTUT.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

The present invention relates to a method for assessing metrology tools. More particularly, the present invention relates to a method of assessing the accuracy of metrology tools using a multi-variable regression analysis. Metrology tools are used, for example, to characterize features during integrated circuit (IC) manufacture. Such features include, for example, line or hole features. The features can be formed from various types of materials such as photoresist, polysilicon, oxide, nitride, or other materials. Metrology tools commonly used in IC manufacture include CD-SEMs, scatterometers (SCMs), CD-AFMs, cross-section SEMs (X-SEMs), and tunneling electron microscopes. Other types of metrology tools are also useful.

Conventionally, metrology tool accuracy assessment assumes that measurement results are determined by a single factor or variable, such as CD. However, we discovered that measurement results based on a single variable can lead to inaccuracies in assessment of metrology tools. For example, measured CD can be influenced by line width, as well as sidewall angle, top corner rounding, profile height and underneath film thickness. Inaccuracies in accessing metrology tools can negatively impact yields.

Figure 1:
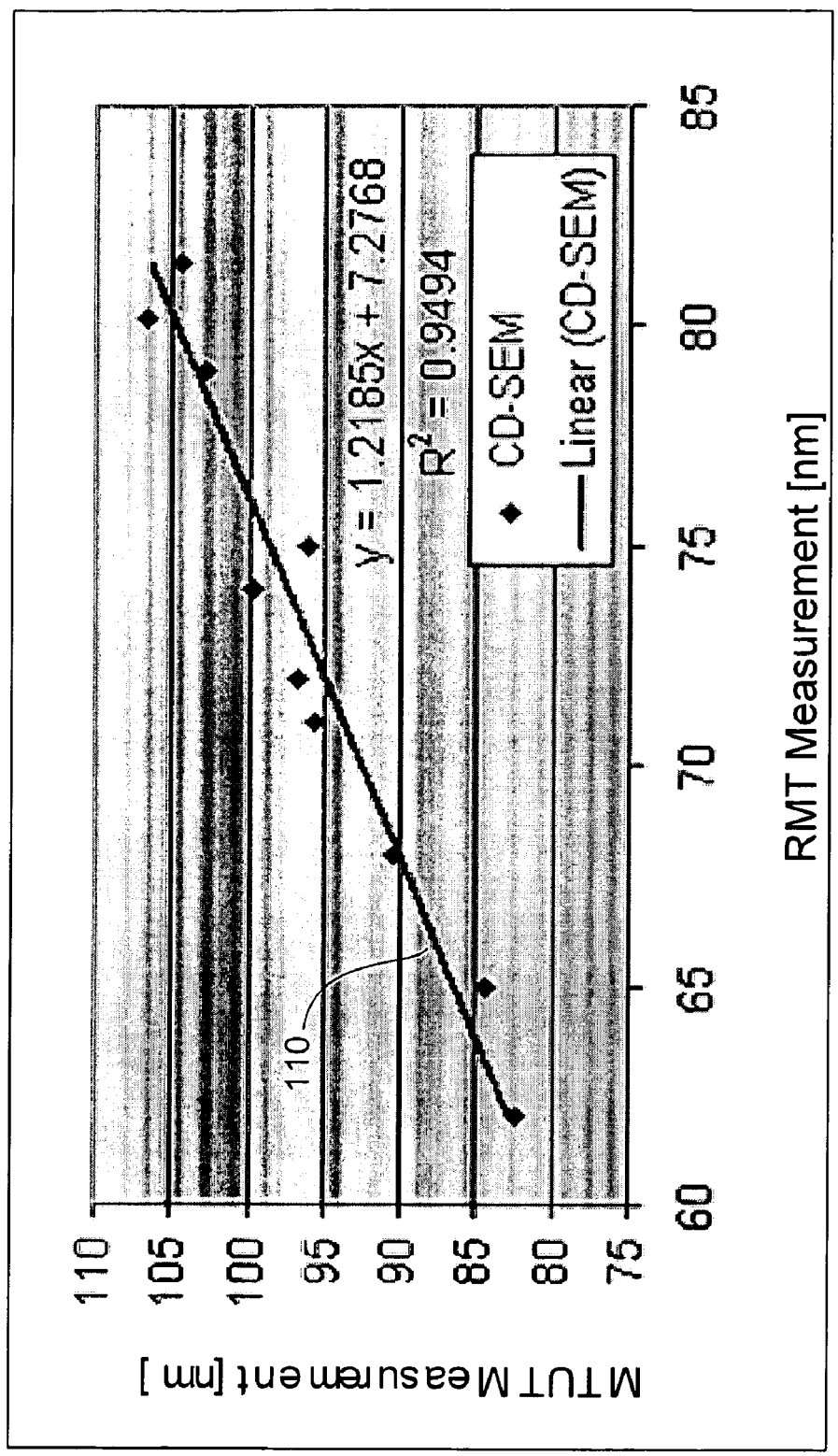
FIG. 1 shows a plot of CD measurement data for a MTUT versus that for a RMT.
Figure 2:
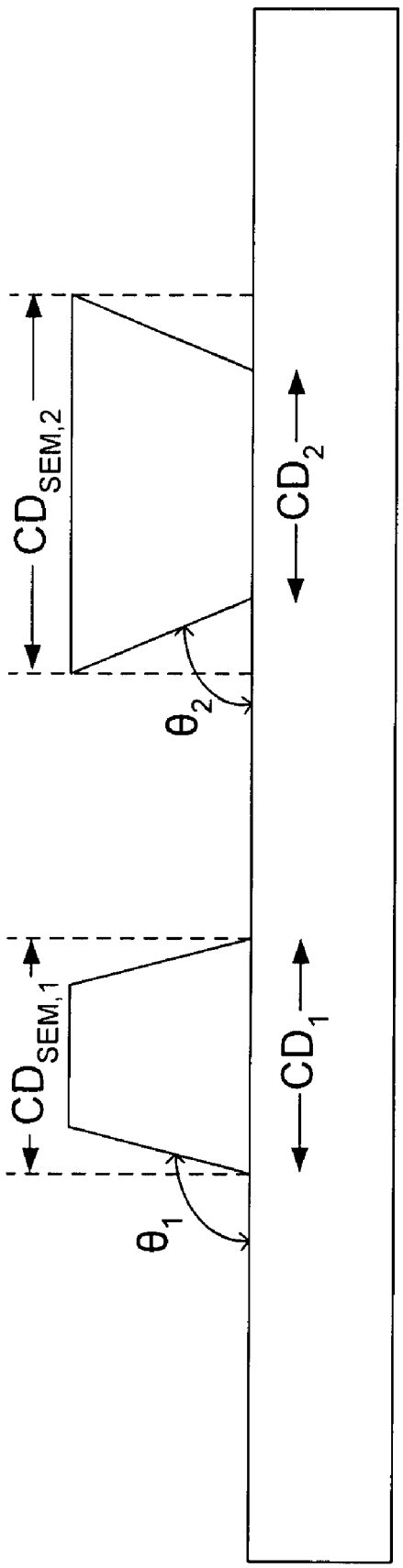
FIG. 2 shows cross-sectional views of various profile features and their effective CDs measured using a top-down CD-SEM.

Referring to FIG. 2, features 220 and 230 from which measurement data is acquired are shown. The features have the same effective CD ($CD_1=CD_2$), but different sidewall angles ($\theta_1 > \theta_2$). As a result, different CD values are measured by a top-down CD-SEM ($CD_{SEM,1} < CD_{SEM,2}$). This is because a top-down CD-SEM is unable to detect the bottom of a re-entry profile. Consequently, the measured CD value inevitably corresponds to the widest portion of the profile, as shown in FIG. 2.

Figure 3:
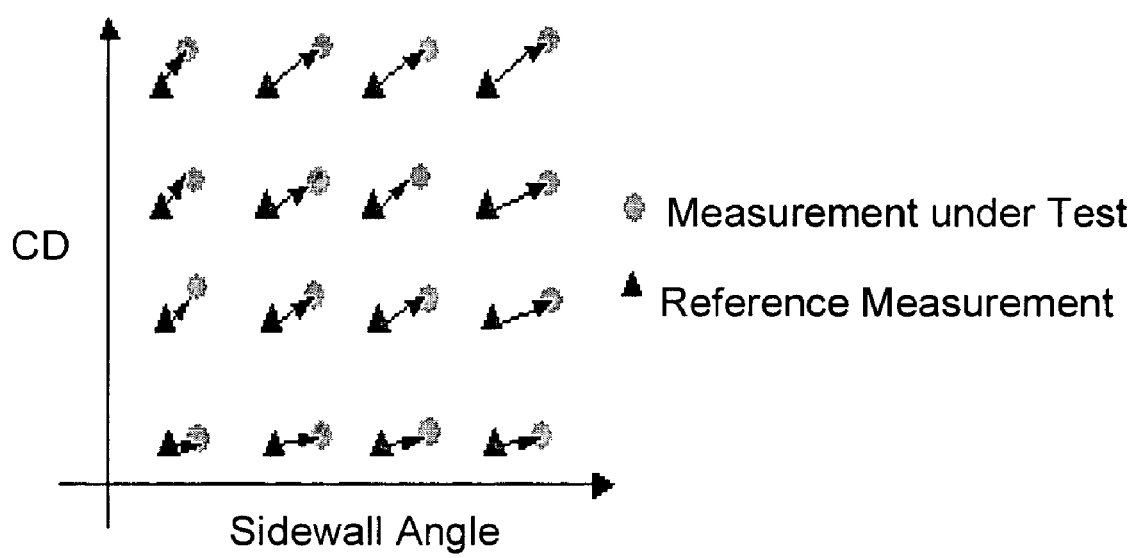
FIG. 3 shows CD measurement data for a CD-SEM and an AFM for profiles having different CDs and sidewall angles.

FIG. 3 shows a comparison of CD measurement data for a CD-SEM as MTUT, with that for an AFM as RMT. Samples having different sidewall angles for the same CD are measured. From FIG. 3, it can be observed that the difference between MTUT and RMT values increases with the sidewall angle of the samples, for the same CD.

Figure 4:
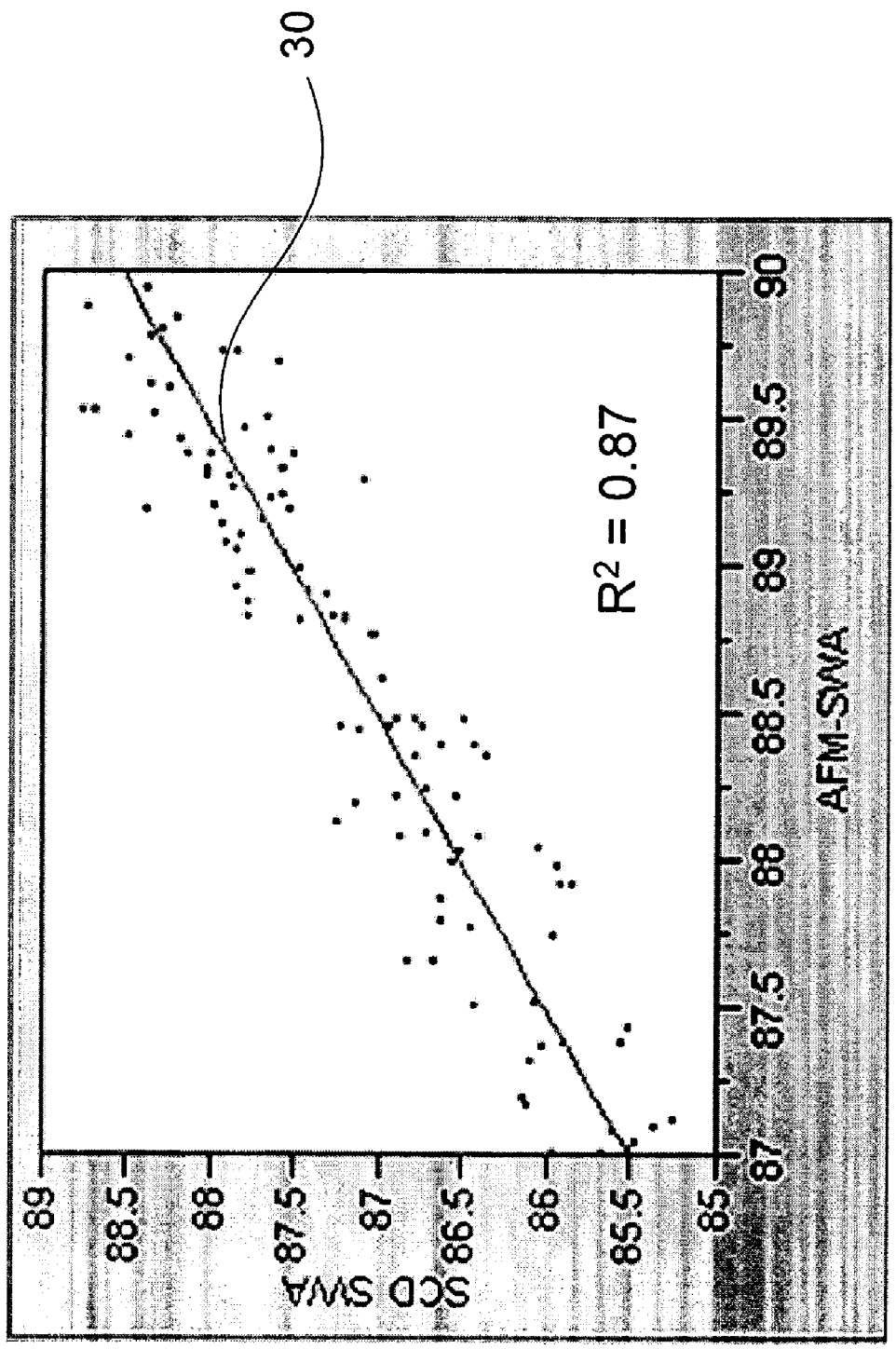
FIG. 4 shows a plot of sidewall angle measured using a MTUT in the form of a SCM as against sidewall angle measured using a RMT in the form of a CD-AFM.

FIG. 4 shows a plot of sidewall angle measured using a MTUT in the form of a SCM (SCM-SWA) as against sidewall angle measured using a RMT in the form of a CD-AFM (AFM-SWA). The SCM measurements correlate poorly to the CD-AFM measurements using a single variable model. This can be seen from the large amount of scatter around the best-fit line 30. The $R^2$ value from the single variable regression is 0.87. The results of FIGS. 3-4 clearly evidence that metrology tool measurements are impacted by more than one factor.

In accordance with one embodiment of the invention, a multi-variable regression is performed to improve accuracy assessment of a metrology tool under test. In such case, the interaction between different measurement parameters can be taken into account, providing a more accurate correlation between the MTUT and the RMT.

Figure 5:
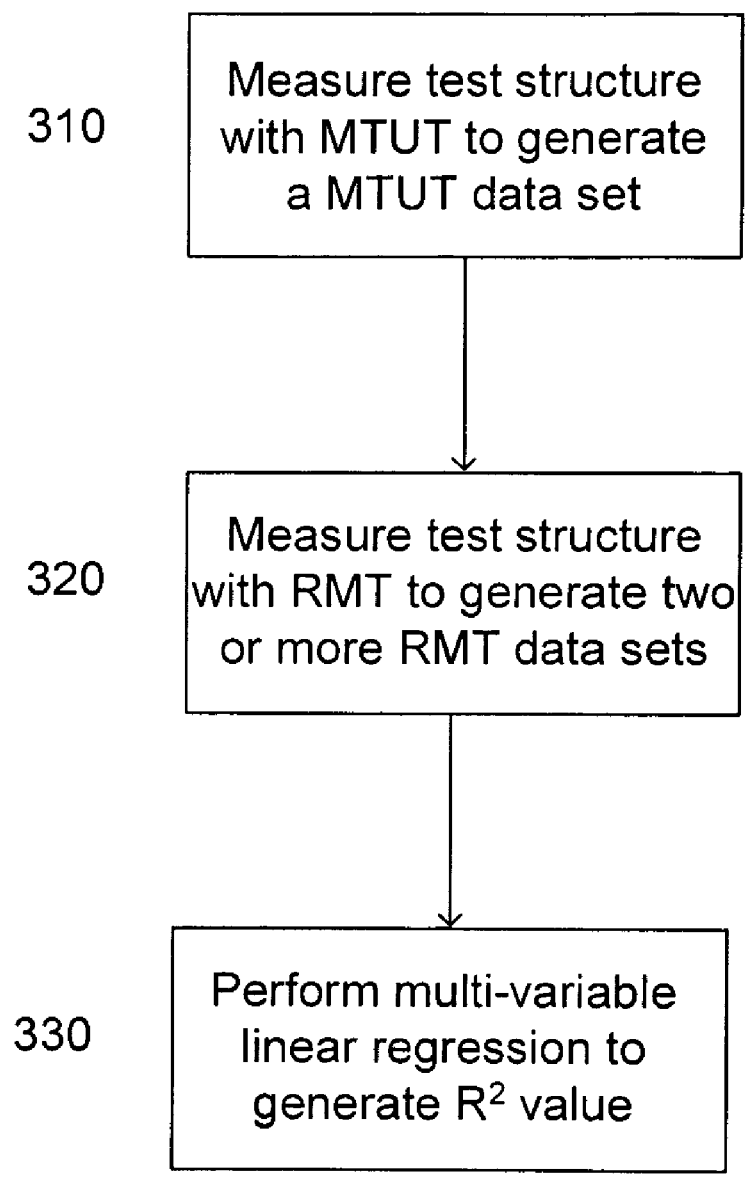
FIG. 5 shows a flow diagram of a method for assessing a metrology tool in accordance with one embodiment of the invention.

FIG. 5 shows a flow diagram 300 of a method for assessing a metrology tool in accordance with one embodiment of the invention. The accuracy of a metrology tool under test (MTUT) is defined with respect to a reference metrology tool (RMT). The RMT can be any metrology tool that can be trusted to determine the true value of the target measurement parameter. In one embodiment, the MTUT and RMT are metrology tools for characterizing a profile feature. The process begins at step 310 where the MTUT is used to measure a target measurement parameter of a plurality of test structures to generate a MTUT data set. The test structures can be incorporated on a substrate of a product wafer or a test wafer. Any useful number or types of test structures can be provided. Preferably, the number of test structures is sufficiently large to ensure reliability of the data collected. In one embodiment, the accuracy of measurements of the target measurement parameter made using the MTUT depends not only on the actual values of the target parameter, but also on other measurement parameters. For example, where the MTUT is a SCM, measured CD values are also dependent on the sidewall angle of the profile.

At step 320, the test structures are measured using the RMT to generate RMT data sets for at least two measurement parameters. Preferably, one of the parameters measured using the RMT is the target parameter measured by the MTUT, while the other parameter(s) influence the determination of the target parameter by the MTUT. In one embodiment, RMT data sets are obtained for two measurement parameters. For example, where the RMT is a CD-AFM, RMT data sets are obtained for profile sidewall angle and CD. In such case, the test structures comprise features having different CDs and sidewall angles. Other numbers of measurement parameters are also useful. For example, a third RMT data set can be obtained for profile height.

At step 330, multi-variable regression is performed. In accordance with one embodiment of the invention, the multi-variable model can be represented by the following equation:

$$y = \sum_{i=1}^{n} a_i \cdot x_i + b$$

where y is the MTUT data set, $x_1, x_2 \ldots x_n$ are the RMT data sets, while $a_1, a_2 \ldots a_n$ and b are the multi-variable regression slope and offset respectively.

The model fitting parameters, $a_i$ and b, are produced using linear regression. The regression can be performed using the ordinary least squares (OLS) or the Mandel approaches. Other techniques may also be useful. The $R^2$ value obtained from the multi-variable regression represents the accuracy index of the MTUT.

Once the MTUT has been assessed, it is used to characterize features, such as line or hole features. Processing parameters of a processing tool are determined based on the characterized features. The processing tool is used to process wafers to form ICs based on the processing parameters.

Figure 6:
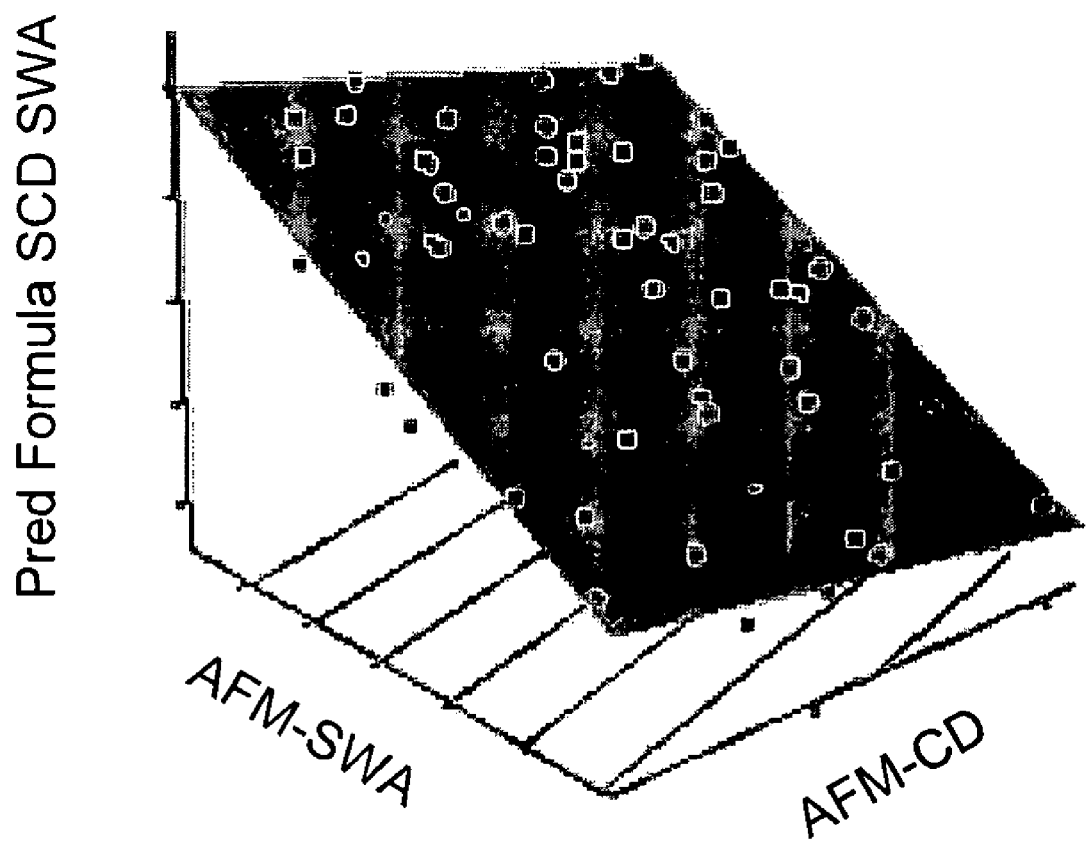
FIG. 6 shows a pareto plot of sidewall angle measured using a MTUT in the form of a SCM as against sidewall angle and CD measured using a RMT in the form of a CD-AFM.

FIG. 6 shows a pareto plot of sidewall angle measured using a MTUT in the form of a SCM (SCM-SWA), on a first (y) axis, as against sidewall angle measured using a RMT in the form of a CD-AFM (AFM-SWA), on a second ($x_1$) axis, and CD measured using the CD-AFM (AFM-CD) on a third ($x_2$) axis. The sidewall angle of the test structures measured using the SCM varies with both the sidewall angle and the CD measured using the RMT, as can be seen from the change in slope of the best-fit plane with respect to both $x_1$ and $x_2$ axes. This indicates that sidewall angle measurements using the SCM are influenced, not only by the "actual" sidewall angle of the test structures, but also their CD. It follows that if a single-variable model were used, the accuracy of the SCM for measuring sidewall angle will not be accurately reflected. Accordingly, the better fit for measured values using a multi-variable model is demonstrated by the higher $R^2$ value of 0.94, as compared with that for a single variable model. Hence if the MTUT is calibrated with more than one parameter, the calibration accuracy will be higher than single parameter calibration.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for assessing a metrology tool under test (MTUT) comprising:
   measuring a target parameter from a plurality of test structures using the MTUT to generate a test data set, the test data set corresponds to a test variable;
   measuring a first reference parameter from the plurality of test structures using a reference metrology tool (RMT) to generate a first reference data set, the first reference data set corresponds to a first reference variable;

measuring a second reference parameter, which is different from the first reference parameter, from the plurality of test structures using the RMT to generate a second reference data set, the second reference data set corresponds to a second reference variable, wherein the first and second reference parameters measured by the RMT are compared with the target parameter measured by the MTUT, and wherein the first reference parameter is the same as the target parameter and the second reference parameter influences the target parameter; and performing a multi-variable regression analysis, wherein a multi-variable model of the multi-variable regression analysis is based on the test variable of the test data set from the MTUT and first and second reference variables of the first and second reference data sets from the RMT.

2. The method of claim 1 wherein the MTUT comprises a first type metrology tool and the RMT comprises a second type metrology tool.

3. The method of claim 2 wherein the first and second types are selected from AFM, SCM, SEM and TEM.

4. The method of claim 2 wherein the first and second types are different types.

5. The method of claim 4 wherein the first and second types are selected from AFM, SCM, SEM and TEM.

6. The method of claim 4 wherein the multi-variable regression analysis comprises ordinary least squares or Mandel.

7. The method of claim 4 wherein the multi-variable regression analysis determines a coefficient of determination, wherein the coefficient of determination represents the accuracy index of the MTUT.

8. The method of claim 1 wherein the multi-variable regression analysis determines a coefficient of determination, wherein the coefficient of determination represents the accuracy index of the MTUT.

9. The method of claim 1 wherein the multi-variable regression analysis comprises ordinary least squares or Mandel.

10. The method of claim 9 wherein the multi-variable regression analysis determines a coefficient of determination, wherein the coefficient of determination represents the accuracy index of the MTUT.

11. The method of claim 1 wherein the target and the first and second reference parameters are selected from critical dimension, sidewall angles, top corner rounding, profile height, underneath film thickness or a combination thereof.

12. The method of claim 1 wherein the target parameter comprises critical dimension of the test structures and the first and second reference parameters comprise critical dimension and sidewall angle of the test structures.

13. The method of claim 1 comprises:
measuring more than two different reference parameters with the RMT to generate more than two different reference data sets corresponding to two or more different reference variables; and
performing a multi-variable regression analysis, wherein a multi-variable model of the multi-variable regression analysis is based on the test variable of the test data set from the MTUT and more than two different reference variables of the more than two different reference data sets from the RMT.

14. A method of fabricating a device comprising:
assessing a metrology tool under test (MTUT) by
measuring a target parameter from a plurality of test structures using the MTUT to generate a test data set, the test data set corresponds to a test variable;

measuring a first reference parameter from the plurality of test structures using a reference metrology tool (RMT) to generate a first second reference data set, measuring a second reference parameter from the plurality of test structures using the RMT to generate a second reference data set, wherein the first and second reference parameters measured by the RMT are compared with the target parameter measured by the MTUT, and wherein the first reference parameter is the same as the target parameter and the second reference parameter influences the target parameter; and performing a multi-variable regression analysis, wherein a multi-variable model of the multi-variable regression analysis is based on the test variable of the test data set from the MTUT and first and second reference variables of the first and second reference data sets from the RMT;

using the assessed MTUT to characterize a feature during processing;

determining processing parameters for a processing tool based on the characterized feature; and processing a wafer on the processing tool based on the processing parameters to form the device.

15. The method of claim 14 wherein the MTUT comprises a first type metrology tool and the RMT comprises a second type metrology tool selected from AFM, SCM, SEM and TEM.

16. The method of claim 14 wherein the multi-variable regression analysis determines a coefficient of determination, wherein the coefficient of determination represents the accuracy index of the MTUT.

17. The method of claim 14 wherein the multi-variable regression analysis comprises ordinary least squares or Mandel.

18. The method of claim 14 wherein the target and the first and second reference parameters are selected from critical dimension, sidewall angles, top corner rounding, profile height, underneath film thickness or a combination thereof.

19. The method of claim 14 wherein the target parameter comprises critical dimension of the test structures and the first and second reference parameters comprise critical dimension and sidewall angle of the test structures.

20. The method of claim 14 comprises:
measuring more than two different reference parameters with the RMT to generate more than two different reference data sets corresponding to two or more different reference variables; and
performing a multi-variable regression analysis, wherein a multi-variable model of the multi-variable regression analysis is based on the test variable of the test data set from the MTUT and more than two different reference variables of the more than two different reference data sets from the RMT.

21. A method for increasing accuracy of assessing a metrology tool under test (MTUT) comprising:
measuring a target parameter from a plurality of test structures using the MTUT to generate a test data set, the test data set corresponds to a test variable;
measuring a first reference parameter from the plurality of test structures using a reference metrology tool (RMT) to generate a first reference data set;
measuring a second reference parameter from the plurality of test structures using the RMT to generate a second reference data set, wherein the first and second reference parameters measured by the RMT are compared with the target parameter measured by the MTUT, and wherein the first reference parameter is the same as the target parameter and the second reference parameter influences the target parameter; and performing a multi-variable regression analysis to determine a coefficient of determination which represents the accuracy index of the MTUT, wherein a multi-variable model of the multi-variable regression analysis is based on the test variable of the test data set from the MTUT and first and second reference variables of the first and second reference data sets from the RMT.

22. The method of claim 21 wherein the MTUT comprises a first type metrology tool and the RMT comprises a second type metrology tool selected from AFM, SCM, SEM and TEM.

23. The method of claim 21 comprises:

measuring more than two different reference parameters with the RMT to generate more than two different reference data sets corresponding to two or more different reference variables; and performing a multi-variable regression analysis, wherein a multi-variable model of the multi-variable regression analysis is based on the test variable of the test data set from the MTUT and more than two different reference variables of the more than two different reference data sets from the RMT.

* * * * *